United States Patent [19]

Nakamura et al.

[11] Patent Number: 5,602,081
[45] Date of Patent: Feb. 11, 1997

[54] METHOD OF PREPARING METAL OXIDE CRYSTAL

[75] Inventors: Masaru Nakamura; Yasuji Yamada, both of Tokyo; Minoru Tagami, Funabashi; Yuh Shiohara, Chigasaki; Shoji Tanaka, Tokyo, all of Japan

[73] Assignees: International Superconductivity Technology Center; Mitsubishi Cable Industries, both of Japan

[21] Appl. No.: 240,068

[22] Filed: May 9, 1994

[30] Foreign Application Priority Data

| May 10, 1993 | [JP] | Japan | 5-108570 |
| May 10, 1993 | [JP] | Japan | 5-108571 |
| May 17, 1993 | [JP] | Japan | 5-115062 |

[51] Int. Cl.⁶ .......................... C30B 15/00; C30B 29/16; C30B 29/22; C30B 15/02
[52] U.S. Cl. ........................ 505/451; 505/729; 117/33; 117/36
[58] Field of Search ................. 117/13, 30, 31, 117/213, 33, 36; 505/729, 450, 451

[56] References Cited

U.S. PATENT DOCUMENTS

| 4,545,849 | 10/1985 | d'Aragona | 117/20 |
| 4,956,334 | 9/1990 | Oka et al. | 505/451 |
| 4,956,339 | 9/1990 | Yamazaki | 505/450 |
| 5,057,492 | 10/1991 | Oka et al. | 505/729 |
| 5,160,401 | 11/1992 | Mateika et al. | 117/13 |
| 5,162,297 | 11/1992 | Terashima et al. | 505/451 |
| 5,217,944 | 6/1993 | Tournier | 505/729 |
| 5,259,919 | 11/1993 | Nakamura | 117/13 |
| 5,268,060 | 12/1993 | Takemura | 505/450 |
| 5,314,869 | 5/1994 | Pandey et al. | 505/729 |
| 5,363,796 | 11/1994 | Kobayashi et al. | 117/30 |
| 5,370,076 | 12/1994 | Okamoto et al. | 117/13 |
| 5,407,907 | 4/1995 | Yamada et al. | 505/451 |

FOREIGN PATENT DOCUMENTS

| 0573193 | 12/1993 | European Pat. Off. | 505/450 |
| 0624664 | 11/1994 | European Pat. Off. | |
| 63-242997 | 10/1988 | Japan | 505/729 |
| 63-310798 | 12/1988 | Japan | 505/729 |
| 63-310799 | 12/1988 | Japan | 505/729 |
| 64-28299 | 1/1989 | Japan | . |
| 1-148796 | 6/1989 | Japan | 505/729 |
| 1-148794 | 6/1989 | Japan | 505/729 |
| 3-228893 | 10/1991 | Japan | 117/30 |
| 4-144990 | 5/1992 | Japan | 117/30 |

OTHER PUBLICATIONS

Chemical Abstracts, vol. 99. No. 24, 12 Dec. 83 No. 204708r.

Nakamura et al., "Crystal Growth of $YBa_2CU_3O_{7-x}$ by the SRL–CP Method Under Low Oxygen Partial Pressure Atmosphere," J. Mater. Res., vol. 9, No. 8, Aug. 1994, pp. 1946–1951.

Yamada et al., "Growth Mechanism of $YBa_2CU_3O_x$ Single Crystal Prepared by Crystal Pulling", Adv. Supercond. V, Proc. Int. Symp. Supercond., 5th, Meeting Date 1992, pp. 561–564.

Yamada et al., "Continuous Crystal Growth of $YBa_2CU_3O_{7-x}$ by the Modified Top–Seeded Crystal Pulling Method", Physica C, vol. 217, No. 1–2, 1993, pp. 182–188.

Primary Examiner—Mary Wicewski
Attorney, Agent, or Firm—Lorusso & Loud

[57] ABSTRACT

A method of preparing a crystal of a Y-series 123 metal oxide is disclosed, in which a substrate is immersed in a liquid phase which comprises components constituting the metal oxide. The liquid phase contains a solid phase located at a position different from the position at which the substrate contacts the liquid phase. The solid phase provides the liquid phase with solutes which constitute the Y-series 123 metal oxide so that the solutes are transported to the position at which the substrate and the liquid phase contact, thereby permitting the Y-series 123 metal oxide to grow on the substrate as primary crystals.

22 Claims, 6 Drawing Sheets

F I G. 4
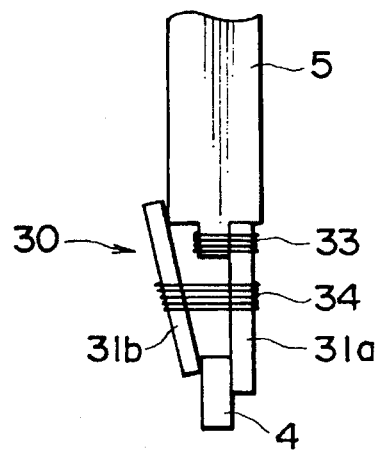
F I G. 5
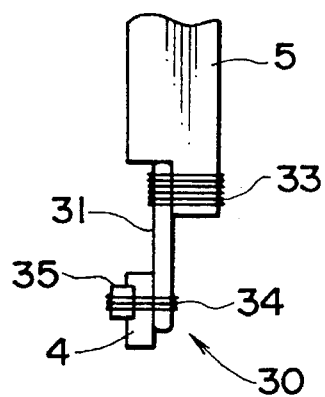
F I G. 6
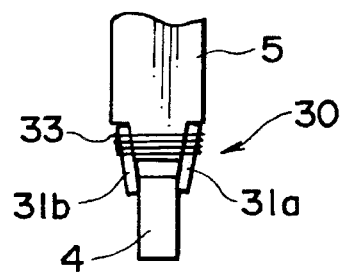

METHOD OF PREPARING METAL OXIDE CRYSTAL

This invention relates to a method of preparing a Y-series 123 metal oxide crystal.

Known methods for the preparation of a thin film of a metal oxides of a Y-series 123 structure include a vacuum deposition method, a sputtering method and a CVD method. These methods, however, have a problem that an expensive and difficult-to-handle apparatus must be used.

The present invention has been made with the foregoing problems of the conventional methods in view.

In accordance with the present invention there is provided a method of preparing a crystal of a Y-series 123 metal oxide, comprising contacting a substrate with a liquid phase which contains a melt of a mixture of metal oxides and in which a solid phase is present at a position different from the position at which said substrate and said liquid phase contact, said solid phase providing said liquid phase with solutes which constitute said Y-series 123 metal oxide so that said solutes are transported to the position at which said substrate and said liquid phase contact, thereby permitting said Y-series 123 metal oxide to grow on said substrate as primary crystals.

Illustrative of suitable metal oxides to be produced by the method of the present invention are Y-series 123 metal oxides, especially superconductive Y-series metal oxides.

The term "Y-series 123 metal oxide" used in the present specification and claims is intended to refer to a metal oxide having the formula:

$$AB_2Cu_3O_{7-x}$$

wherein A stands for a rare earth element such as Y, Sm or Pr, B stands for an alkaline earth metal such as Ba and x is a number of 0–1.

The solid phase to be used in the method of the present invention is preferably a Y-series 211 metal oxide. The term "Y-series 211 metal oxide" used in the present specification and claims is intended to refer to a metal oxide having the formula:

$$A_2BCuO_{5-x}$$

wherein A, B and x have the same meaning as above.

As the liquid phase, any desired metal oxide mixture may be used. Generally, a melt of a mixture of CuO and BaO is preferably used. A liquid phase consisting of CuO and BaO may be obtained by admixing at least two oxide sources selected from a source of copper oxide, a source of barium oxide and a source of BaCu oxide to form an admixture, the admixture being subsequently heated at a temperature of, for example, 880° C. for 40 hours. In this case, it is desirable that the molar ratio of Ba to Cu should be 3:5 to 3:8.

The weight ratio of the liquid phase to the solid phase is preferably 2–10 parts by weight per part by weight of the solid phase.

As the substrate, it is preferred that a metal oxide having corrosion resistance to the liquid phase be used. Illustrative of suitable substrates are those formed of $SmBa_2Cu_3O_{7-x}$ crystal, $PrBa_2Cu_3O_{7-x}$ crystal, magnesia single crystal and $YBa_2Cu_3O_{7-x}$ crystal. The substrate may serve to function as a seed crystal.

Preferred embodiments of the present invention will be described below with reference to the accompanying drawings, in which:

FIGS. 4–9 are elevational views each schematically showing a supporting mechanism for holding a substrate;

Figure 1:
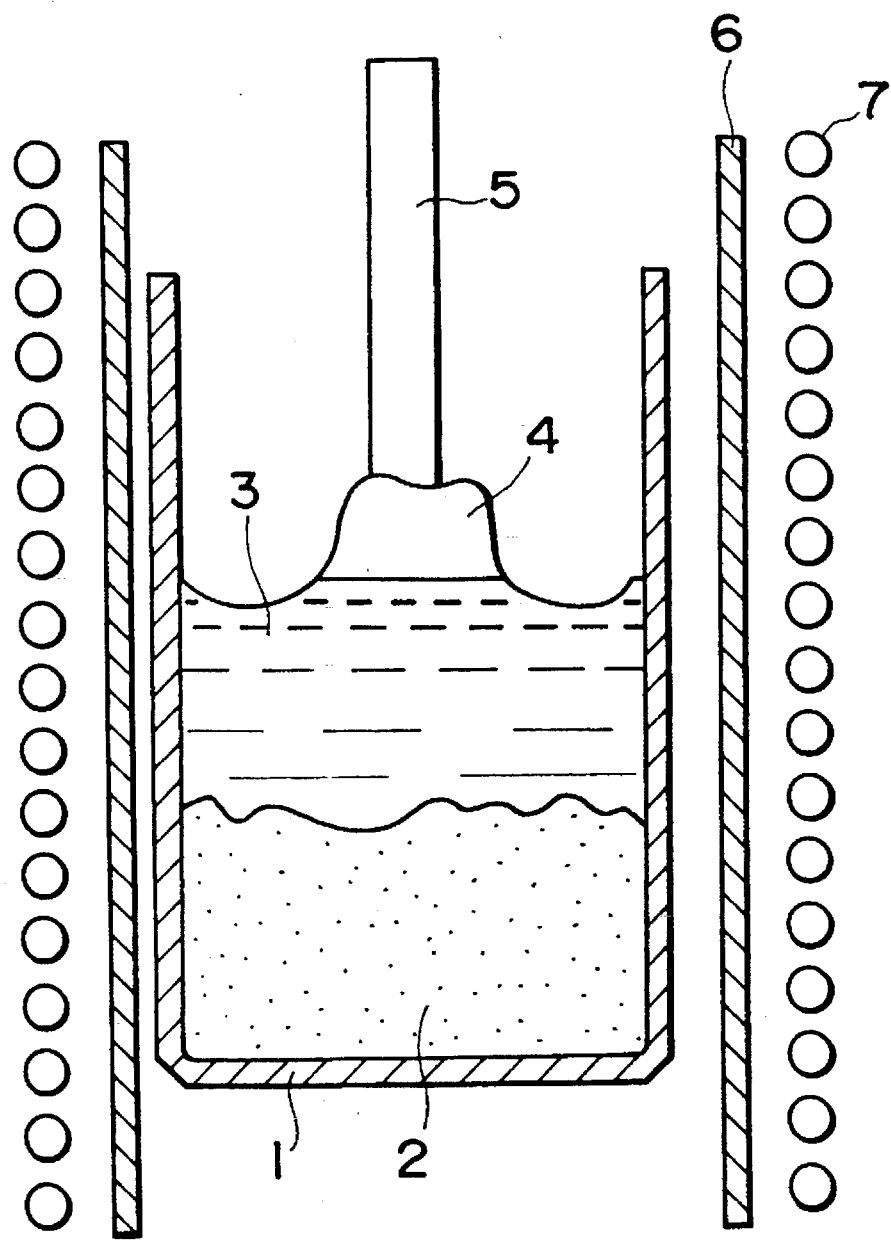
FIG. 1 is a cross-sectional, elevational view diagrammatically showing an apparatus useful for carrying out the method of the present invention.

Referring to FIG. 1, designated as 1 is a crucible formed of a material which does not react with the liquid phase and which does not adversely affect the properties of the desired metal oxide crystal, such as yttria, magnesia, alumina or stabilized zirconia. The crucible 1 is placed within a high frequency induction oven having an induction coil 7 surrounding a platinum susceptor 6. Provided in the bottom of the crucible 1 is a solid phase 2 of $Y_2BaCuO_5$ above which a liquid phase 3 is formed. The reference numeral 4 designates a substrate of $SmBa_2Cu_3O_{7-x}$ crystal held by a pulling up bar 5.

The substrate 4 is immersed in the liquid phase 3 while controlling the temperature of the liquid phase 3 so as to cause the crystal of the desired Y123 series metal oxide to deposit on the substrate 4. For the acceleration of the deposition and for the prevention of the nucleation of Y123 series metal oxide, the temperature of the liquid phase 3 adjacent to the substrate 4 is made lower by about 20° C. than a temperature at which the crystal of the metal oxide is equilibriously stable. In an alternative, the substrate is slowly pulled up at a rate of 0.01–10 mm per hour.

It is preferred that the crucible 1 be held in an atmosphere selected from vapors of elemental silver, vapors a silver alloy (e.g. silver-palladium alloy) or vapors of a silver compound or be immersed in a melt selected from that of elemental silver, that of silver alloys and that of silver compounds, for reasons of preventing the overflow of the liquid phase 3 from the crucible 1.

Hitherto, the preparation of Y-series 123 metal oxide has been performed using a crucible placed on a ceramic refractory material. In this case, the BaO-CuO melt contained in the crucible tends to flow upward along the inside wall thereof and overflows therefrom. As a result, the amount of the liquid phase in the crucible is considerably reduced so that it is impossible to continue the process for a desired period of time.

It has been found that when the crucible is held in the above-described atmosphere or immersed in the above-described melt, the overflow and loss of the liquid phase can be prevented. In this case, it is further desirable that the crucible have an outer surface coated with silver, a silver alloy or a silver compound. In addition, the crucible is preferably supported by a spacer formed of a magnesia single crystal.

Figure 2:
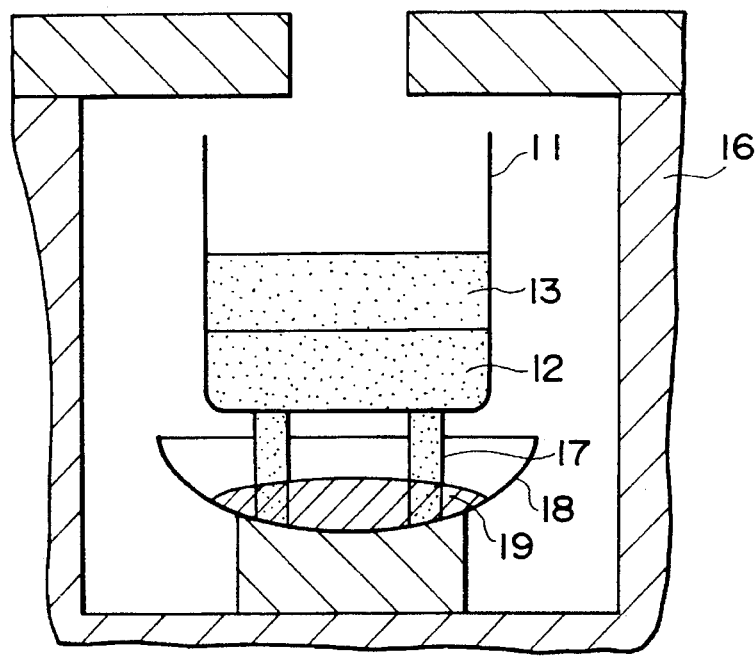
FIG. 2 is a partial, cross-sectional, elevational view diagrammatically showing another embodiment of an arrangement for supporting a crucible for containing reactants.

Referring to FIG. 2, designated as 11 is a crucible disposed within a furnace and containing a solid phase 12 above which a liquid phase 13 is provided. The crucible 11 and the solid and liquid phases 12 and 13 are the same as described with reference to FIG. 1. Designated as 16 is a refractory material. The crucible 11 is placed on spacers 17 which are formed of a magnesia single crystal and disposed in a tray such as an alumina dish 18. Contained in the alumina dish 18 is silver, a silver alloy or a silver compound. By heating the crucible 11 arranged as above, the preparation of the metal oxide can be performed while maintaining the crucible 11 in the atmosphere of vapors of silver, a silver alloy or a silver compound.

Figure 3:
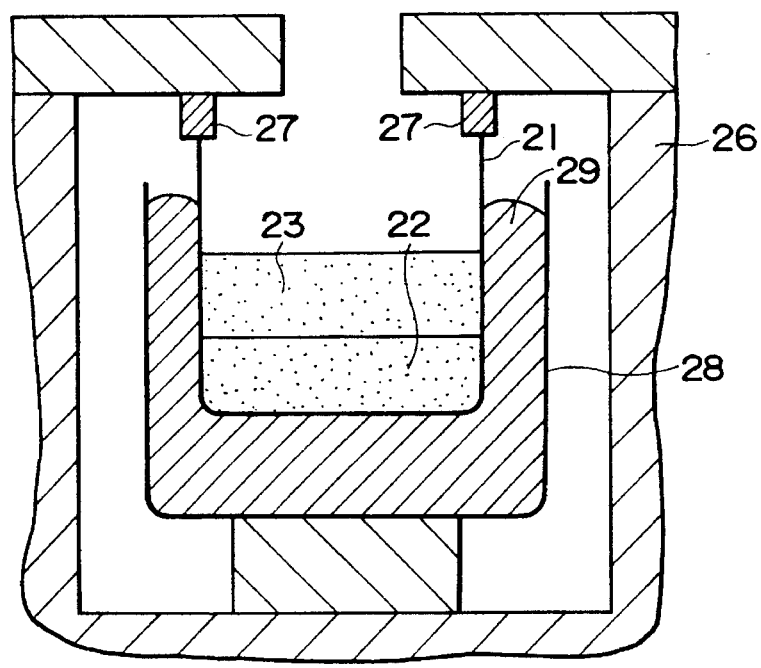
FIG. 3 is a view, similar to FIG. 2, showing a further embodiment.

FIG. 3 shows another embodiment. Designated as 21 is a crucible disposed within a furnace and containing a solid phase 22 above which a liquid phase 23 is provided. The crucible 21, and the solid and liquid phases 22 and 23 are the same as described with reference to FIG. 1. Designated as 26 is a refractory material. The crucible 21 is immersed in a melt of silver, a silver alloy or a silver compound contained in an alumina vessel 28. Designated as 27 are spacers interposed between the top of the crucible 21 and the lower surface of the top refractory material 26.

When the substrate immersed in the liquid phase is slowly pulled up for the deposition and growth of a Y-series 123 metal oxide thereon, a holder made of platinum, alumina polycrystal, yttria-stabilized zirconia crystal, calcia-stabilized zirconia polycrystal has been used for holding the substrate. When the known holder is used for the formation of a Y-series 123 metal oxide, the liquid phase tends to climb the substrate and to transmit to the holder. Since the liquid phase is reactive with the holder, it is difficult to continue the process for a long period of time.

In accordance with a preferred embodiment of the present invention, the substrate is held by such a holder that at least that portion thereof by which the substrate is engaged is formed of a material which is substantially inert to and unwettable with the liquid phase.

Figure 10:
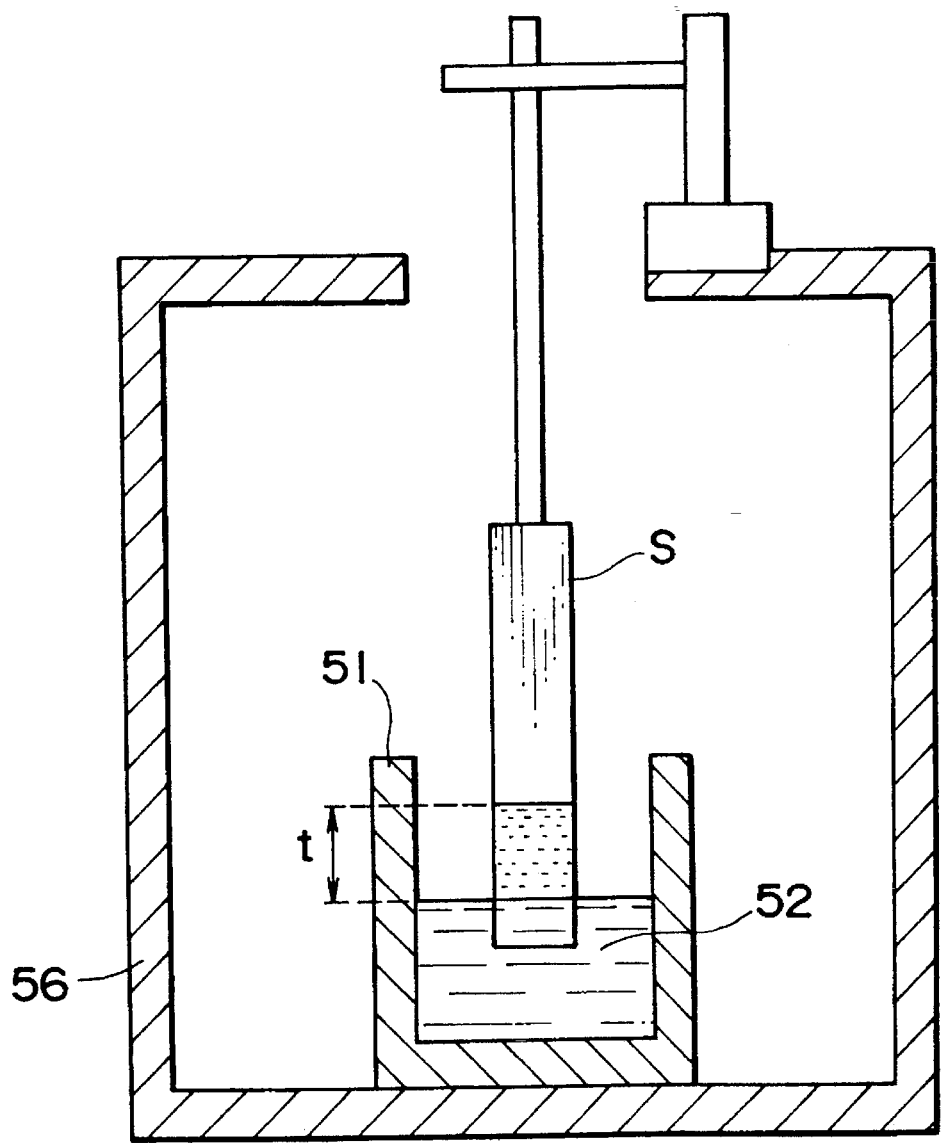
FIG. 10 is a cross-sectional, elevational view diagrammatically showing the manner of a wettability test performed in the working example.

Whether or not a material of a holder is wettable may be determined as follows:

As shown in FIG. 10, a sample S having a length of 50 mm, a thickness of 3 mm and a width of 15 mm is immersed by a depth of 5 mm for 15 hours in a melt 52 of a mixture of BaO and CuO (Ba/Cu molar ratio of 3:7) contained in a 10 ml crucible 51, with the longitudinal axis of the sample being oriented normal to the surface of the melt 52. The melt is maintained at 1,050° C. When the distance "t" through which the melt ascends along the sample after 15 hours immersion is not greater than 5 mm, then the-sample is regarded as being unwettable.

Whether or not a material of a holder is inert may be determined as follows:

A sample similar to above is subjected to the same test as above. When the sample after the 15 hours immersion retains the original shape, then the sample is regarded as being inert.

Preferably, a magnesia single crystal is used as the material for the holder. Especially preferred is the use of a holder whose surface with which the substrate engages is a (100) plane of a magnesia single crystal.

Examples of holders are illustrated in FIGS. 4–9.

Referring to FIG. 4, designated generally as 30 is a holder having a supporting member 5 made of a material capable of withstanding a high temperature of about 1,100° C., such as alumina. A first arm 31a formed of a substantially inert, unwettable material is bound to the supporting member 5 with a wire such as a platinum wire 33, while a second arm 31b similar to the first arm 31a is engaged by a substrate (seed material) 4 and the supporting member 5 and is bound to the first arm 31a with a wire such as a platinum wire 34 so that the substrate is grasped by the two arms 31a and 31b.

In the embodiment of FIG. 5, an arm 31 is bound to a supporting member 5 with a wire 33. To the arm 31 is held a substrate 4 with a wire 34. A splint 35 formed of the same material as the arm 33 is used to prevent the direct contact between the wire 34 and the substrate 4.

In the embodiment of FIG. 6, a substrate 4 is grasped by a pair of arms 31a and 31b which are bound to a supporting member 5 with a wire 33.

Figure 7:
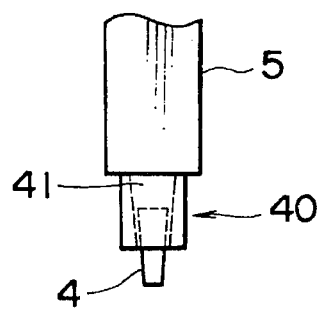

In the embodiment of FIG. 7, a substrate 4 has a conical shape. A holder 40 has a supporting member 5 to which a block 41 formed of a substantially inert, unwettable material is secured. The block 41 has a central through-hole whose diameter is gradually reduced from the upper side to the lower side for fitting engagement with the tapered substrate 4.

Figure 8:
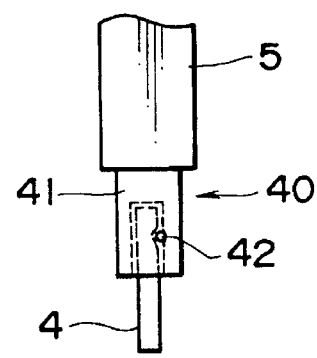

In the embodiment of FIG. 8, a rod-like substrate 4 having a groove is inserted into a bore of a block 41 provided with a through-hole. The substrate 4 is held by the block 41 by means of a pin 42 extending through the through-hole of the block as well as the groove of the substrate 4. The block 41 is formed of a substantially inert, unwettable material. The pin is preferably formed of platinum.

Figure 9:
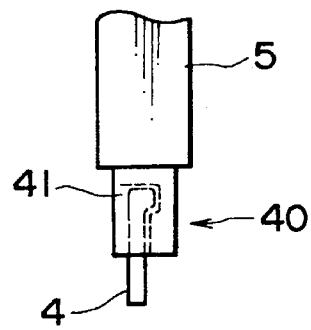

In the embodiment of FIG. 9, a rod-like substrate 4 having a hooked end portion is inserted into a bore of a block 41. The substrate 4 is held by the block 41 by engagement of the hooked end portion thereof with a recess of the bore of the block 41.

The following examples will further illustrate the present invention.

EXAMPLE 1

A film of $YBa_2Cu_3O_{7-x}$ crystal was formed on a substrate of $SmBa_2Cu_3O_{7-x}$ crystal using an apparatus illustrated in FIG. 1. A yttria crucible 1 having an inside diameter of 30 mm and a height of 50 mm was used. Barium carbonate and copper oxide were mixed with a molar ratio of Ba/Cu of 3:5 and, then, calcined at 880° C. for 40 hours. In the crucible 1 was placed 1 part by weight of $Y_2BacuO_5$ as the solid phase 2, to which was added 4 parts by weight of the above calcined mixture. The crucible 1 was placed inside of the platinum susceptor 6 and the contents in the crucible was heated to about 1,000° C. by energization of the induction coil 6 so that there was formed the liquid phase 3 above the solid phase 2. A substrate 5 of $SmBa_2Cu_3O_{7-x}$ crystal was immersed in the liquid phase 3 so that the temperature of the liquid phase was lowered by about 20° C., whereby the crystal of $YBa_2Cu_3O_{7-x}$ deposited on the substrate.

EXAMPLE 2

Example 1 was performed in the same manner as described except that the $SmBa_2Cu_3O_{7-x}$ substrate was replaced by the product obtained in Example 1 and that $Y_2BaCuO_5$ was used as the solid phase, thereby to form a layer of $PrBa_2Cu_3O_{7-x}$ on the layer of $YBa_2Cu_3O_{7-x}$.

EXAMPLE 3

A crucible 11 similar to that used in Example 1 was placed in a furnace as shown in FIG. 2. The crucible 11 contained the same liquid and solid phases 12 and 13 as used in Example 1. As shown in FIG. 2, the crucible 11 was placed on spacers 17 each formed of a magnesia single crystal and having a height of 10 mm. The spacers 17 were placed in an alumina dish 18 having a depth of 5 mm. Elemental silver (15 g) having a purity of 99% was also placed in the dish 18. The above assembly was heated at 960°–1,000° C. (generally adopted in the preparation of a metal oxide). The silver 19 contained in the dish 18 was melted and the crucible 11 was maintained in the atmosphere of vapors of silver. The above condition was maintained for 7 days. Substantially no loss of the liquid phase was observed. For the purpose of comparison, the above procedure was repeated in the same manner as described except that the crucible was directly placed on the refractory material 16. After 3 days from the commencement of the heating, the liquid phase 13 flowed out of the crucible 11.

EXAMPLE 4

Example 3 was repeated in the same manner as described using the arrangement shown in FIG. 3 in lieu of that of FIG. 2. Each of the spacers 27 had a size of 1 mm×10 mm×10 mm. The liquid phase 23 was found to be retained in the crucible 21 more than 7 days.

EXAMPLE 5

Example 3 was repeated in the same manner as described except that the crucible 11 had an outside surface coated with silver by vacuum deposition and that no silver was placed in the dish 18. The liquid phase was found to be retained in the crucible for 5 days.

EXAMPLE 6

$YBa_2Cu_3O_{7-x}$ crystal was prepared using a holder illustrated in FIG. 5. A magnesia-single crystal having a size of 1 mm×5 mm×10 mm was used as an arm 31 while a magnesia single crystal having a size of 1 mm×5 mm×3 mm was used as a splint 35. The arm 31 was fixed to an alumina rod serving as a supporting member 5 and having a diameter of 4 mm with a platinum wire 33. A seed material 4 of $SmBa_2Cu_3O_{7-x}$ crystal (about 1 g, 10 mm×3 mm×3 mm) was then fixed to the arm 31 using the splint 35 and a platinum wire 34.

Into a yttria crucible having an inside diameter of 50 mm and a height of 50 mm were charged $Y_2BaCuO_5$ (solid phase) and a calcined mass obtained by calcining a mixture of barium carbonate and copper oxide (a molar ratio of Ba/Cu of 3:5) at 880° C. for 40 hours. The crucible was placed inside of a furnace and the contents in the crucible was heated so as to create such a temperature gradient that the bottom was 1,100° C. while the was 1,080° C. After lowering the temperature of the contents in the crucible to a bottom temperature of 1,015° C. and a surface temperature of 1,000° C., the seed material held by the holder was immersed into the melt in the crucible and then continuously pulled up at a rate of 0.2 mm per hour for about 50 hours while being rotated at 100 revolutions per minute (rpm), whereby the crystal of $YBa_2Cu_3O_{7-x}$ was allowed to deposit on the seed crystal bar and to grow. The distance through which the liquid phase in the crucible ascended along the arm 31 was less than 5 mm. Thus, it was possible to continuously perform the growth of the crystal for 50 hours without any trouble.

EXAMPLE 7

Figure 11:
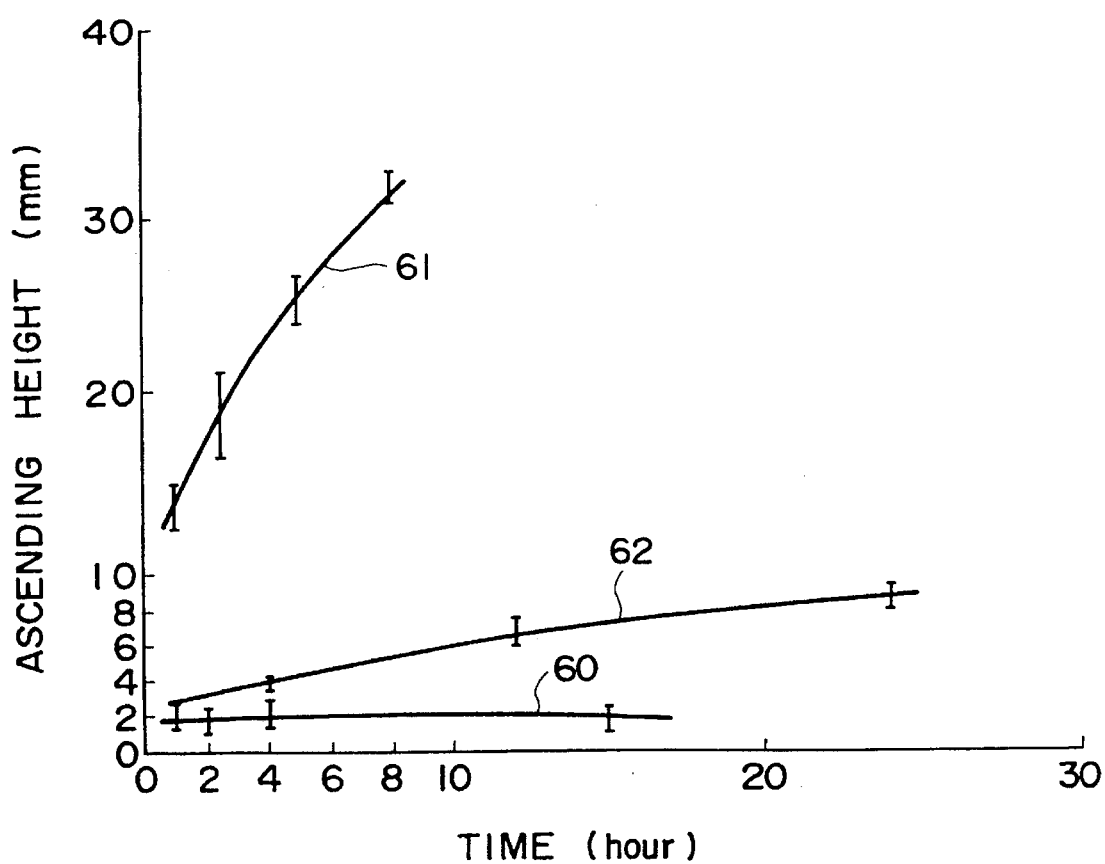
FIG. 11 is a graph showing the results of the above test.

A magnesia single crystal having a size of 3 mm×15 mm×50 mm was tested for the wettability using a device shown in FIG. 10. The sample S was immersed in a melt 52 of oxides (Ba:Cu molar ratio of 3:7) contained in a 10 ml crucible 51 with the longitudinal axis of the sample being oriented normal to the surface of the melt 52 and with the (001) cleavage surface of the sample being in contact with the melt 52. The sample was then allowed to stand for 15 hours while maintaining the melt at 1,050° C. The distance "t" through which the melt ascended along the sample was measured. The results are shown in FIG. 11. For the purpose of comparison, the above procedure was repeated using magnesia polycrystal and yttria- stabilized zirconia single crystal in lieu of magnesia single crystal. The results are also shown in FIG. 11. As will be appreciated from FIG. 11, magnesia single crystal is substantially unwettable (Curve 60). In the case of magnesia polycrystal (Curve 61), the distance "t" exceeds 5 mm immediately. In the case of yttria-stabilized zirconia single crystal (Curve 62), about 5 hours from the commencement of the test the distance "t" exceeds 5 mm.

We claim:

1. A method of preparing a crystal of a Y-series 123 metal oxide, comprising contacting a metal oxide substrate with a liquid phase which contains a melt of a mixture of metal oxides and in which a solid phase is present at a position different from the position at which said substrate and said liquid phase contact, said solid phase providing said liquid phase with solutes which constitute said Y-series 123 metal oxide so that said solutes are transported to the position at which said substrate and said liquid phase contact, thereby permitting said Y-series 123 metal oxide to grow on said substrate as primary crystals, said substrate serving as a seed crystal for growth of said Y-series 123 metal oxide, wherein said liquid phase is contained in a crucible which is held in an atmosphere selected from the group consisting of vapors of silver, vapors a silver alloy or vapors of a silver compound.

2. A method as set forth in claim 1, wherein said solid phase is a Y-series 211 metal oxide.

3. A method as set forth in claim 1, wherein said substrate is selected from the group consisting of $SmBa_2Cu_3O_{7-x}$ crystals, $PrBa_2Cu_3O_{7-x}$ crystals, magnesia single crystals and $YBa_2Cu_3O_{7-x}$ crystals.

4. A method as set forth in claim 1, wherein said liquid phase includes a mixture of CuO with BaO.

5. A method as set forth in claim 1, wherein said crucible has an outer surface coated with silver, a silver alloy or a silver compound.

6. A method as set forth in claim 1, wherein said crucible is supported on a spacer formed of a magnesia single crystal.

7. A method of preparing a crystal of a Y-series 123 metal oxide, comprising contacting a metal oxide substrate with a liquid phase which contains a melt of a mixture of metal oxides and in which a solid phase is present at a position different from the position at which said substrate and said liquid phase contact, said solid phase providing said liquid phase with solutes which constitute said Y-series 123 metal oxide so that said solutes are transported to the position at which said substrate and said liquid phase contact, thereby permitting said Y-series 123 metal oxide to grow on said substrate as primary crystals, said metal oxide substrate serving as a seed crystal for growth of said Y-series 123 metal oxide, wherein said liquid phase is contained in a crucible which is immersed in a melt selected from the group consisting of silver, silver alloys and silver compounds.

8. A method as set forth in claim 7, wherein said solid phase is a Y-series 211 metal oxide.

9. A method as set forth in claim 7 wherein said substrate is selected from the group consisting of $SmBa_2Cu_3O_{7-x}$ crystals, $PrBa_2Cu_3O_{7-x}$ crystals, magnesia single crystals and $YBa_2Cu_3O_{7-x}$ crystals.

10. A method as set forth in claim 7 wherein said liquid phase includes a mixture of CuO and BaO.

11. A method as set forth in claim 7 wherein said crystal of a Y-series 123 metal oxide is in the form of a film.

12. A method as set forth in claim 7, wherein said crucible is coated with silver, a silver alloy or a silver compound.

13. A method as set forth in claim 7, wherein said crucible is supported on a spacer formed of a magnesia single crystal.

14. A method as set forth in claim 7, wherein said substrate is vertically pulled at a rate of 0.01–10 mm per hour.

15. A method of preparing a crystal of a Y-series 123 metal oxide, comprising:

engaging a metal oxide substrate within a holder; and contacting said substrate, held by said holder, with a liquid phase which contains a melt of a mixture of metal oxides and in which a solid phase is present at a position different from the position at which said substrate and said liquid phase contact, said solid phase providing said liquid phase with solutes which constitute said Y-series 123 metal oxide so that said solutes are transported to the position at which said substrate and said liquid phase contact, thereby permitting said Y-series 123 metal oxide to grow on said substrate as primary crystals, wherein at least that portion of said holder by which said substrate is engaged is formed of a magnesia single crystal having a surface defined by a (100) plane, said substrate engaging said surface.

16. A method as set forth in claim 15, wherein said solid phase is a Y-series 211 metal oxide.

17. A method as set forth in claim 15, wherein said substrate is selected from the group consisting of $SmBa_2Cu_3O_{7-x}$ crystals, $PrBa_2Cu_3O_{7-x}$ crystals, magnesia single crystals and $YBa_2Cu_3O_{7-x}$ crystals.

18. A method as set forth in claim 15, wherein said liquid phase includes a mixture of CuO and BaO.

19. A method as set forth in claim 15 wherein said crystal of a Y-series 123 metal oxide is in the form of a film.

20. A method as set forth in claim 1 wherein said crystal of a Y-series 123 metal oxide is in the form of a film.

21. A method as set forth in claim 15, wherein said substrate is vertically pulled at a rate of 0.01–10 mm per hour.

22. A method as set forth in claim 1, further comprising contacting said substrate on which said metal oxide has been formed with another liquid phase which contains a melt of a mixture of BaO and Cuo and in which another solid phase is present at a position different from the position at which said substrate and said another liquid phase contact, said another solid phase providing said another liquid phase with solutes which constitute another metal oxide so that said solutes are transported to the position at which said substrate and said another liquid phase contact, thereby permitting said another metal oxide to grow on said substrate as primary crystals.

* * * * *